United States Patent [19]

Liau et al.

[11] Patent Number: 4,777,148

[45] Date of Patent: Oct. 11, 1988

[54] PROCESS FOR MAKING A MESA GAINASP/INP DISTRIBUTED FEEDBACK LASER

[75] Inventors: Zong-Long Liau, Arlington; Dale C. Flanders, Lexington; James N. Walpole, Concord, all of Mass.

[73] Assignee: Massachusetts Institute of Technology, Cambridge, Mass.

[21] Appl. No.: 91,653

[22] Filed: Sep. 1, 1987

Related U.S. Application Data

[62] Division of Ser. No. 696,648, Jan. 30, 1985, Pat. No. 4,722,092.

[51] Int. Cl.$^4$ ............................................. H01L 21/208
[52] U.S. Cl. ............................ 437/129; 148/DIG. 65; 148/DIG. 95; 148/DIG. 72; 156/647; 156/649; 156/655; 437/130; 437/133; 437/958; 437/981; 357/56; 357/17
[58] Field of Search ............... 148/DIG. 65, DIG. 95, 148/DIG. 72; 156/610–614, 624, 647, 649, 655; 437/26, 104, 107, 126, 129, 130, 133, 958, 981; 357/17, 56

[56] References Cited

U.S. PATENT DOCUMENTS

| | | | |
|---|---|---|---|
| 3,786,368 | 1/1974 | Bjorkholm et al. | 331/94.5 |
| 3,958,188 | 5/1976 | Fletcher et al. | 331/94.5 C |
| 3,970,958 | 7/1976 | Streifer et al. | 331/94.5 C |
| 3,991,386 | 11/1976 | Bjorklund et al. | 331/94.5 F |
| 4,023,993 | 5/1977 | Scifres et al. | 148/172 |
| 4,045,749 | 8/1977 | Burnham et al. | 437/129 |
| 4,096,446 | 6/1978 | Haus et al. | 331/94.5 C |
| 4,178,604 | 12/1979 | Nakamura et al. | 357/18 |
| 4,190,813 | 2/1980 | Logan et al. | 331/94.5 H |
| 4,206,468 | 6/1980 | Carballes | 357/17 |
| 4,230,997 | 10/1980 | Hartman et al. | 357/56 |
| 4,257,011 | 3/1981 | Nakamura et al. | 331/94.5 H |
| 4,468,850 | 9/1984 | Liau et al. | 29/569 L |
| 4,496,403 | 1/1985 | Turley | 437/129 |
| 4,561,915 | 12/1985 | Mito | 437/129 |
| 4,575,919 | 3/1986 | Logan et al. | 437/129 |
| 4,662,988 | 5/1987 | Renner | 156/649 |

FOREIGN PATENT DOCUMENTS

| | | | |
|---|---|---|---|
| 0207388 | 12/1982 | Japan | 437/129 |
| 0092591 | 5/1984 | Japan | 437/129 |
| 0103393 | 6/1984 | Japan | 437/129 |
| 0130492 | 7/1984 | Japan | 437/129 |
| 0227177 | 12/1984 | Japan | 437/129 |

OTHER PUBLICATIONS

"High Quality 1.3 $\mu$m GaInAsP/InP BH–DFB Lasers with First-Order Gratings", H. Okuda et al., *Electronics Letters*, Oct. 27, 1983, vol. 19, No. 22, pp. 941–943.

"Distributed Feedback $Pb_{1-x}Sn_xTe$ Double–Heterostructure Lasers", J. N. Walpole et al., *Appl. Phys. Lett.*, vol. 29, No. 5, Sep. 1, 1976, pp. 307–309.

"Coupled-Wave Theory of Distributed Feedback Lasers", H. Kogelnik et al., *J. Appl. Phys.* vol. 43, No. 5, May 1972, pp. 2327–2335.

(List continued on next page.)

*Primary Examiner*—Brian E. Hearn
*Assistant Examiner*—William Bunch
*Attorney, Agent, or Firm*—Hamilton, Brook, Smith & Reynolds

[57] ABSTRACT

A distributed feedback (DFB) type laser and a method and apparatus for forming same wherein a quaternary semiconductor active lasing strip of material is buried between a substrate of binary compound of one type conductivity material and a mesa binary compound body of opposite type conductivity and a periodic grating structure is etched into the plateau of the mesa. In one embodiment, ohmic contacts are provided on either side of the grating structure and the mesa is undercut adjacent the active strip to partly isolate the ohmic contacts from the homojunction formed when the active strip is buried, preferably using a mass-transport process. In another embodiment, the ohmic contacts are formed on the top of a deeply etched grating structure. A buried layer double heterostructure (DH) laser is also described with DFB grating formed on the side walls of the layer. Additionally, a surface emitting diode laser with DFB is described.

33 Claims, 7 Drawing Sheets

OTHER PUBLICATIONS

"1.5 μm Range InGaAsP/InP Distributed Feedback Lasers", Sakai et al., *IEEE Journal of Quantum Electronics*, vol. QE-18, No. 8, Aug. 1982, pp. 1272–1278.

"Low-Threshold and High-Temperature Single-Longitudinal-Mode Operation of 1.55 μm-Band DFB-DC-PBH LDs", M. Kitamura et al., *Electronics Letters*, 5 Jul. 1984, vol. 20, No. 14, pp. 595–596.

"CW Operation of Distributed Feedback, $Pb_{1-x}Sn_xTe$ Lasers", J. N. Walpole et al., *Applied Physics Letters*, vol. 30, No. 10, May 15, 1977, pp. 524–526.

"Continuous-Wave Operation of 1.5 μm Distributed-Feedback Ridge-Waveguide Lasers", L. D. Westbrook et al., *Electronics Letters*, 15 Mar. 1984, vol. 20, No. 6, pp. 225–226.

"1.53 μm DFB Lasers by Mass Transport", B. Broberg et al., *Electronics Letters*, Aug. 16, 1984, vol. 20, No. 17, pp. 692–694.

"Heteroepitaxial Ridge-Overgrown Distributed Feedback Laser at 1.5 μm", W. T. Tsang et al., *Applied Physics Letter*, 45(12), Dec. 15, 1984, pp. 1272–1274.

"Deformation-Free Overgrowth of InGaAsP DFB Corrugations", A. W. Nelson et al., *Electronics Letters*, Jan. 20, 1983, vol. 19, No. 2, pp. 34–36.

"New 1.5 μm Wavelength GaInAsP/InP Distributed Feedback Laser", Y. Itaya et al., *Electronics Letters*, Nov. 11, 1982, vol. 18, No. 23, pp. 1006–1008.

"Low Threshold GaInAsP/InP Buried-Heterostructure Lasers with a Chemically Etched and Mass-Transported Mirror", Liau et al., *Applied Physics Letter*, 44(10), May 15, 1984, pp. 945–947.

PROCESS FOR MAKING A MESA GAINASP/INP DISTRIBUTED FEEDBACK LASER

GOVERNMENT SUPPORT

The Government has rights in this invention pursuant to Contract No. F19628-85C-0002, awarded by the Department of the Air Force.

This application Ser. No. 696,648, filed Jan. 30, 1985 now U.S. Pat. No. 4,722,092.

TECHNICAL FIELD

This invention is in the field of semiconductor lasers and more particularly relates to GaInAsP/InP distributed feedback (DFB) lasers for use as stable single-frequency sources.

BACKGROUND ART

Semiconductor lasers capable of producing continuous stimulated radiation at wavelengths in the vicinity of 1.1–1.7 um (micrometers) at room temperature are of interest for communications systems using fiber optics, since it is in this wavelength range that both the transmission losses and the dispersion in high-quality glass fibers are low.

Semiconductor lasers of quaternary III-V alloys of GaInAsP grown on a binary compound of InP (double-heterostructures or DH) have proven particularly satisfactory for operation at this frequency range. Furthermore, the distributed feedback (DFB) type of laser construction has been of particular importance for producing narrow spectral width stable mode lasers.

The genesis of the DFB laser goes back to Kogelnik et al., "Coupled-Wave Theory of Distributed Feedback Lasers", *J. Appl. Phys.*, Vol. 43, No. 5, (May 1972) pp. 2,327–2,335). In essence, a DFB laser comprises a light waveguide with a grating or periodic structure adjacent thereto. The spacing of the perturbations of the periodic structure are selected to be an integral number of half wavelengths of the desired light frequency within the laser, such that the perturbations produce Bragg Scattering which couples and reinforces right and left light waves traveling through the light guiding layer in a coherent manner such that reflections are in phase [See U.S. Pat. No. 3,970,958, issued July 20, 1976]. Deviations in periodicity of the grating structure are therefore highly undesirable.

More recently, DH type DFB laser devices have been constructed [See, for example, K. Sakai, "1.5 um Range InGaAsP/InP Distributed Feedback Lasers", *IEEE J. Quantum Electron.*, QE-18, 1272 (1982)]. These lasers combine the advantages of the DH structures with the frequency stability attainable with DFB gratings.

Recently, a novel technique for burying the active layer where fabricating, non-DFB, BH type lasers was described in U.S. Pat. No. 4,468,850 to Liau et al. issued Sept. 4, 1984, which utilizes a "mass transport phenomenon" to bury the active layer. Briefly, in this mass-transport formed DH laser, an active layer of quaternary III-V alloy is grown on a binary III-V compound substrate and a top layer of a binary III-V compound is similarly epitaxially grown on the active layer. An oxide stripe mask is formed by conventional photolithography techniques on the top layer.

An undercut mesa structure is then formed by a two-step selective chemical etch. A first etchant is used to remove the top layer where it is not protected by the oxide coating. This top layer is removed down to the active quaternary layer at which point the first etchant step is immediately terminated and a new etchant is used to remove the active layer underneath the remaining top layer, except for a thin volume of active material underlying the remaining top mesa structure.

Next, the structure is subjected to a controlled temperature cycle which produces a transport of material so as to fill in the void left at the undercut region and thereby enclose the sides of the remaining volume of the active material. Then, ohmic contacts are provided across the device to enable current to be passed through the structure to produce lasing.

Despite the above improvements in technology which extend over a decade, a need still exists for a DH-DFB laser of relatively simple construction which can be produced with high yield and performance.

A chief cause for the complexity and low yield of the prior devices is (1) the requirement of close optical coupling between the grating and the active layer waveguide region coupled with (2) the necessity of isolating the ohmic contacts of the laser diode from the grating structure to prevent loss of optical power caused by absorption in the metal contacts. Moreover, usually the metallization for the ohmic contact is sintered, or alloyed. If metals are alloyed into the semiconductor grating structure the grating structure melts and its performance deteriorates. Hence the mutually conflicting problem that the metallization must be kept distant from the guiding layer but the grating relatively close.

This has led the prior art workers to locate the grating under the active layer, or to locate the grating over the active layer and then grow an isolating layer on the grating. The ohmic contact is then formed over the isolating layer.

Both of these approaches suffer from the distinct disadvantages that:

(1) mass transport of the grating material can occur while heating the wafer prior to growth of layer(s) over the grating. This smooths out the grating and reduces its height and hence the coupling of the light between grating and waveguide region. It is particularly difficult to achieve a first-order grating in which the tooth spacing equals half the wavelength in such a manner because of the extremely small dimensions. For a laser emitting at a wavelength of 13 um the internal wavelength is about 4000 Å.

(2) it is difficult to obtain good uniformity and good morphology in layers grown over a non-planar corrugated grating structure;

(3) the internal wavelength of the laser and, hence, the desired grating periodicity depend upon the exact value of the optical index of the dielectric waveguide formed. Until all the layers are grown and the actual thicknesses of each are known, the optical index of the dielectric waveguide is not precisely known.

DISCLOSURE OF THE INVENTION

The present invention relates to a novel process and apparatus for making laser diodes, and more specifically, DH type DFB laser diodes in which the grating or periodic structure is formed on the plateau of a mesa of semiconductor material of opposite conductivity to a substrate semiconductor material. An active layer strip having a bandgap narrower than that of the substrate or mesa material is formed in the mesa between the two opposite type conductivity materials by mass-transport techniques. The grating is formed directly above the active strip after the mesa has been formed and the active strip is buried. Two ohmic contact strips are also formed on either side of the grating on the mesa plateau. The mesa is deeply undercut on both sides adjacent the active strip in the mass-transport process of burying the active strip. This partly isolates the contact strips from a homojunction which extends from the active strip to the undercut. This homojunction is formed when the active strip is buried and the material from the substrate and top layer fill in the void. The contact strips are formed adjacent, rather than over, the gratings to avoid absorption and scattering of light waves. An oxide coating is provided on the grating.

In this manner, a DH type DFB laser is provided which is relatively simple to fabricate and which avoids the problem of grating degradation during subsequent fabrication, since the DFB grating is formed at a later stage of fabrication. This also allows for more complete characterization of the wafer upon which the laser(s) are formed before the grating is fabricated.

Although the grating is located relatively distant from the light-guiding layer (active layer), good coupling of the light to the grating occurs if the last layer is kept reasonably thin (approximately 1 micrometer) or if the grating can be etched deeply enough so that it reaches to within about 0.8 micrometers of the guiding (active) layer or strip. Optical coupling is good because the index discontinuity at the grating interface (between the semiconductor material of the top layer and an oxide overcoating) is large compared to the index discontinuity at a grating interface between layers of different semiconductor alloys. Note that grating height, index discontinuity and distance between the grating and the light-guiding layer all determine the coupling (or efficiency) of the grating. When the grating is etched in the top layer, only a three layer waveguide need be grown. When the grating is buried in the structure, an additional layer with another composition is required to provide index discontinuity. The thickness of this additional layer must be carefully controlled, as well as the thickness of the active layer, making successful fabrication more difficult.

Thus, the advantages noted above should considerably increase the production yield of devices made in accordance with the invention and eliminate the expensive cost of forming DFB gratings on defective DH or gratings with periodicity not suitably matched to the wavelength of the waveguide region.

BRIEF DESCRIPTION OF THE DRAWINGS

FIGS. 7(a-d) are schematicized perspective views of an alternative embodiment etching process in which the DFB grating is formed on the edges of the buried active strip.

BEST MODES OF CARRYING OUT THE INVENTION

DFB Grating Between Contact Strips

Figure 1:
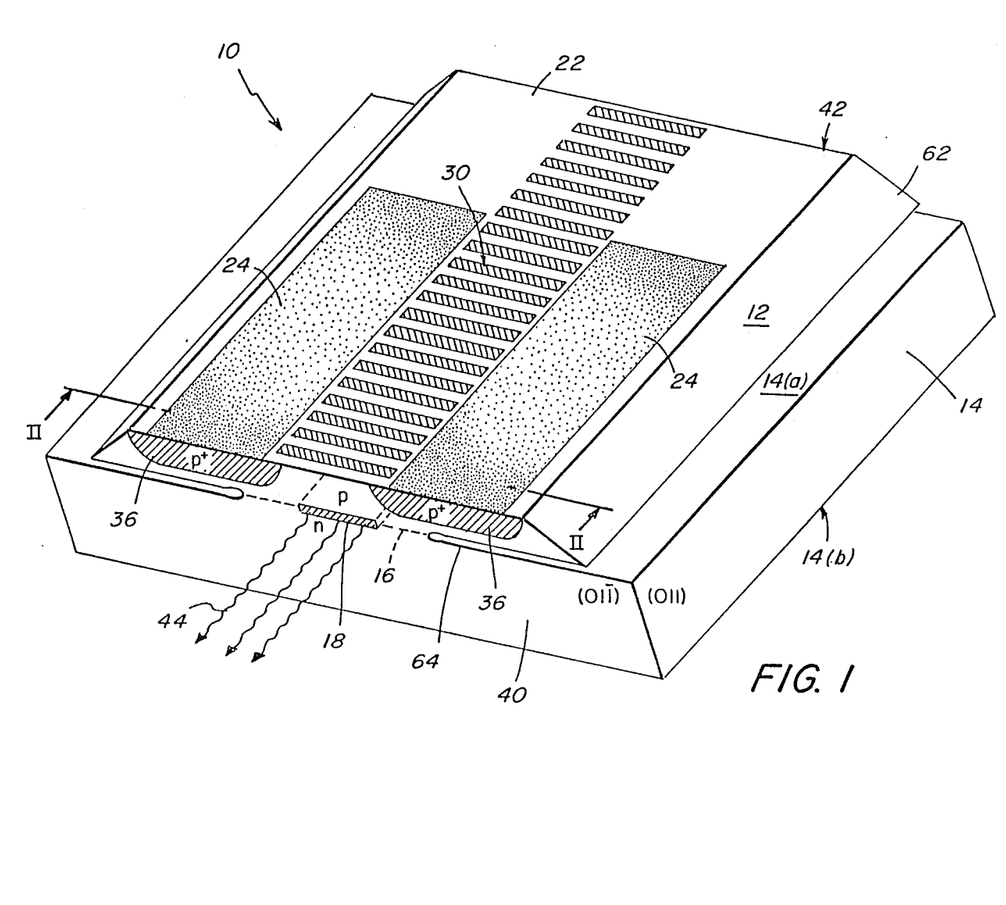
FIG. 1 is a schematicized perspective view of one diode in a wafer of a GaInAsP/InP DH type laser diodes with DFB grating formed in accordance with the invention.
Figure 2:
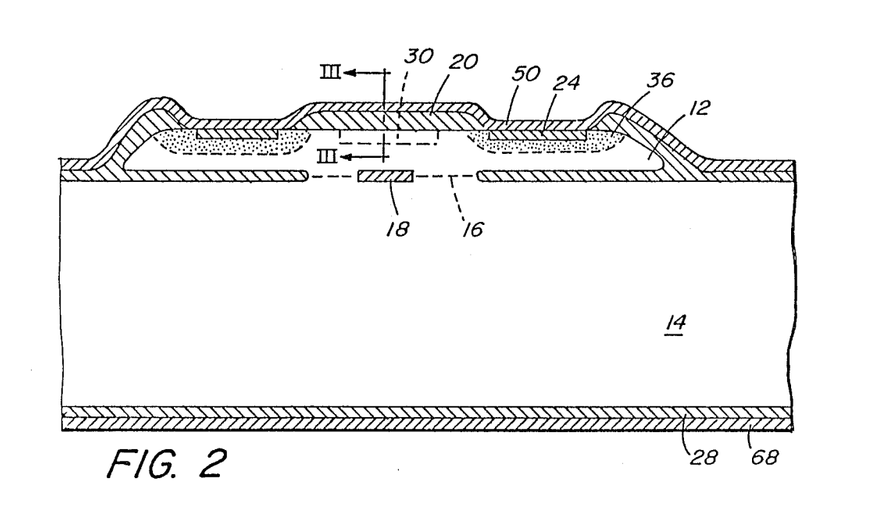
FIG. 2 is an enlarged cross-sectional view of a portion of the diode 10 of FIG. 1 taken along lines II—II.

FIGS. 1 and 2 may be referred to for purposes of explaining a first embodiment of the invention in which a DFB grating is formed on a mesa plateau between two adjacent ohmic contact strips. It should be noted that some of the metallization and oxide coating details have been omitted in FIG. 1 for simplification but have been included in the detailed sectional view of FIG. 2. While only the final structure is shown herein, it may be helpful to review the process from the beginning.

The starting structure consists of an n-doped indium phosphide substrate 14 having planar top and bottom major surfaces 14a and 14b, respectively. A gallium indium arsenide phosphide very thin (0.16 microns) active layer (Note, only the final strip 18 is shown) is formed over substrate 14 and a thin (1.0±0.2 micron) p-doped indium phosphide top layer 12 is formed by conventional epitaxial growth techniques, such as Liquid Phase Epitaxy (LPE). Using photolithographic techniques, oxide stripes are provided over the top layer 12. The stripes of oxide are 10 um wide on 254 um centers with the stripes parallel to the (011) or (01$\bar{1}$) crystallographic planes. Preferably the substrate 14 is oriented in the (100) crystallographic plane.

Next, mesa structures 62 are formed by etching. Concentrated HCL or Bromine-methanol etchant is used to remove the portions of the InP top layer 12 not underlying the oxide stripes down to the active layer. The oxide is then removed and both sides of the exposed layer are removed and undercut to a depth of about 5.5 microns leaving a narrow strip 18 of no greater than about 2 microns. The structure is then heat-treated at a temperature of about 640°-670° C. preferably in the presence of phosphine to cause migration of the material adjacent the undercut thereby burying the active strip 18 on both sides of the mesa 62 with a long narrow undercut region 64 underlying the mesa top surface of plateau 22. Then, a first-order grating corrugation 30 with a periodicity of 2028 A and a tooth height h (See FIG. 3) of approximately 2500 A is formed using contact X-ray lithography, preferably with a holographically generated mask pattern and ion-beam-assisted etching using chlorine gas. The structure is subsequently coated with a phosphosilicate glass (PSG) layer 20 of 0.4 um thickness (not shown in FIG. 1) and a pair of stripe openings where the ohmic contacts 24 are to be located are defined in the PSG layer 20 on top of the laser mesa 62 adjacent the grating 30 by photolithography and chemical etching. Note that no openings are made in the PSG layer 20 designed for the unpumped section since ohmic contacts are not required there. A shallow zinc diffusion is made through the openings in the oxide forming p+ doped InP regions 36. After the zinc diffusion, Au/Zn/Au alloyed contacts 24 are made to the p+ indium phosphide diffused region 36 on the indium phosphide mesa top layer 12.

The sample is then lapped from the substrate side to a thickness of 100 microns and a AuSn alloyed contact 28 applied to the bottom surface of the structure, followed by Ti/Pt/Au layers 68.

Each finished device has a cleaved front facet 40 where the laser output is emitted (shown by arrows 44) and output power is measured. The rear end 42 is either cleaved or saw-cut. The devices are first tested for their pulsed threshold currents and then mounted p-side up on copper heatsinks for cw operation and spectral examination.

Figure 4:
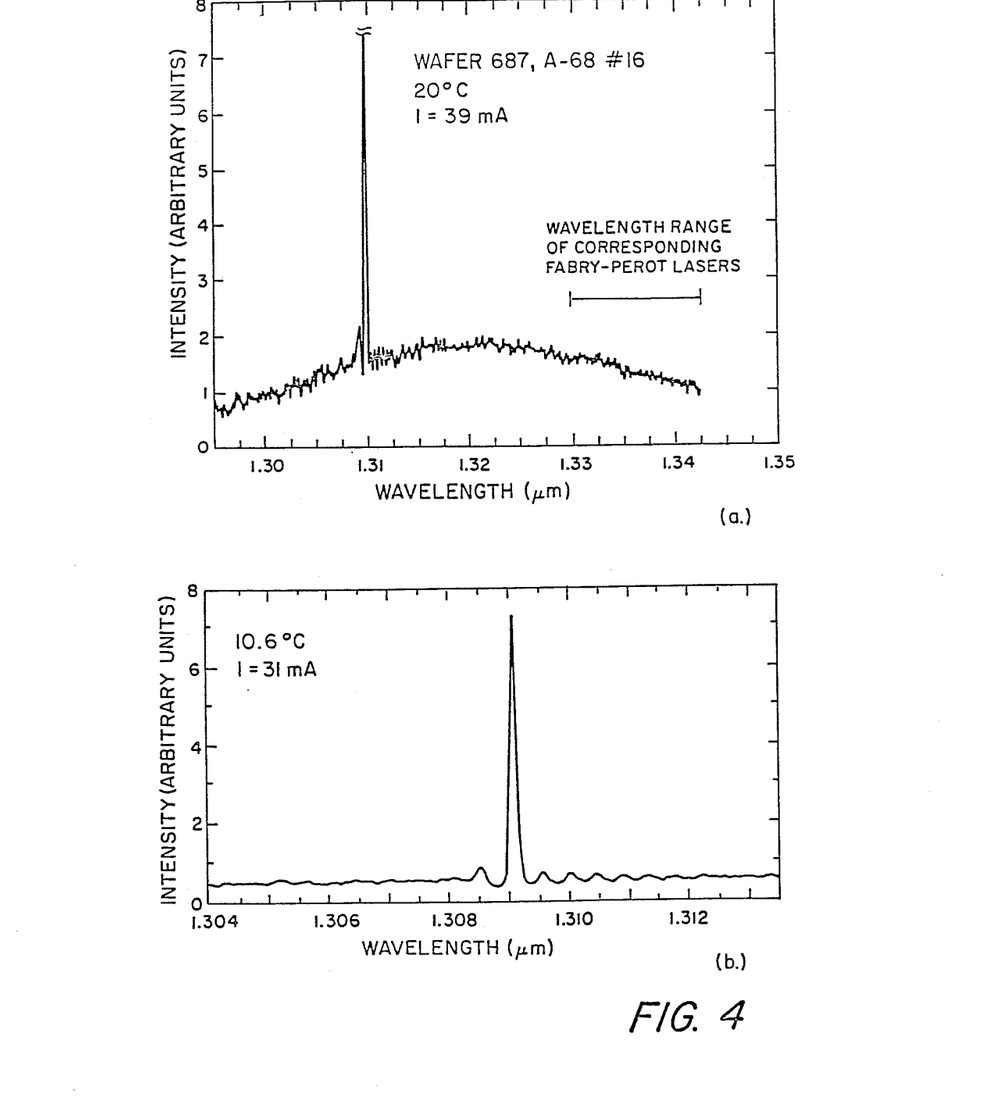
FIG. 4 shows an emission spectra of one device made in accordance with FIGS. 1-3 operated just above the lasing threshold at (a) 20° C. and (b) 10.6° C. Part (a) shows that the lasing modes are located on the shorter-wavelength side of the apparent spontaneous emission spectrum. The expanded wavelength scale in Part (b) shows more details of the lasing spectrum.

Devices fabricated with a relatively long cavity (546 and 241 um for pumped and unpumped sections, respectively) and saw-cut rear end show room-temperature pulsed threshold currents as low as 16 mA. FIG. 4 shows cw emission spectra of a device just above its lasing threshold. FIG. 4a is a plot of intensity v wavelength at 20° C. and threshold current I of 39 mA. As evident in FIG. 4a, the dominant lasing mode with a wavelength of 1.3098 um is located on the shorter-wavelength side of the apparent spontaneous emission spectrum and is a strong indication that the device is lasing in a DFB mode, since the Fabry-Perot modes should be located on the other side of the spontaneous spectrum where the gain maximum occurs. This is confirmed by the Fabry-Perot mode operation at wavelengths of 1.33-1.34 um observed in shorter devices cleaved from the same wafer but without the unpumped section and saw-cut end, as indicated in FIG. 4a. (Since the present DFB resonance wavelength is approximately 260-Å away from the gain maximum, the Fabry-Perot mode can have a lower threshold current in devices without the unpumped and saw-cut end.) FIG. 4b shows a similar spectrum at 10.6° C. and on different scales. Note the threshold current drops to 31 mA. The series of peaks are likely the DFB modes with the dominant one just outside the stop band.

At higher currents, the dominant mode continues to grow, and the other DFB modes are at −37 dB when the current is 60 mA (which is approximately 1.54 times the threshold current $I_{th}$). However, a pair of modes of unknown origin with a −32 dB intensity is observed at ±50 Å of the dominant DFB mode.

Shorter devices with smaller unpumped sections and both ends cleaved show room-temperature cw threshold currents as low as 13.5 mA but with more complicated mode behaviors. A device with pumped and unpumped sections of 318 and 152 um, respectively, showed a cw threshold current of 16 mA at room temperature and single-frequency operation (with side modes estimated at −30 dB) up to at least 2.5 $I_{th}$ (with an output power of 2.8 mW) but with a mode hop from $\lambda = 1.3054$ to 1.3092 um at 1.6 $I_{th}$. Other devices with little or no unpumped sections lase in Fabry-Perot modes in the spectral region of 1.33-1.34 um but still show considerably better mode purity than similar devices fabricated without the grating. (The latter also lase at wavelengths of 1.33-1.34 um.)

The long devices with unpumped sections sections and saw-cut rear ends clearly show that good DFB lasers can be obtained with the present invention, even though the DFB resonance wavelength is some 260 Å away from the gain maximum. In fact, the 16 mA threshold current achieved in this work is already comparable to the lowest reported to date for the DFB diode laser (Okuda et al., "High Quality 1.3 um GaInAsP/InP BH-DFB Lasers with First-Order Gratings", *Electronics Letters*, Vol. 19, No. 22, pp. 942-943, Oct. 27, 1983). Still lower threshold currents can possibly be achieved when the DFB resonance wavelength and the gain maximum are better matched. The use of unpumped regions to suppress Fabry Perot oscillations would then not be needed. Furthermore, the present device is considerably simpler than more conventional DFB diode lasers in terms of the waveguide and current-confinement structures and fabrication procedures. In particular, the grating is fabricated after the wafer growth is completed. This not only avoids the problems associated with prior art DFB lasers which require growth over the grating with consequent impairment of the grating, but also allows the wafer to be more thoroughly characterized before the grating is fabricated, thereby achieving better yield and performance.

To our knowledge, the present device is the first DFB diode laser of III-V compound semiconductors fabricated with the grating placed on top of the cap layer, although a similar configuration has previously been used in a IV-VI laser (Walpole et al., "Distributed Feedback $Pb_{1-x}Sn_xTe$ Double-heterostructure Lasers", *Appl. Phys. Lett.*, Vol. 29, No. 5, Sept. 1, 1976). The Walpole et al. device, supra, operated at a wavelength near 13.4 microns and at a temperature below 77° K. At this wavelength and low temperature, the ohmic contact over the grating does not absorb the laser radiation. Hence interaction between the metal ohmic contact and the guided mode in the pumped laser section is not a problem at this frequency. Moreover, the ohmic contact formed on the $PB_{1-x}Sn_xTe$ lasers does not require alloying which can seriously degrade the grating. Hence, the grating may be located over the top or cap layer 12 in such devices without difficulties. The converse appears at the frequency spectrum of III-V compound semiconductor lasers which lase at wavelengths generally shorter than about 2 microns.

Figure 5:
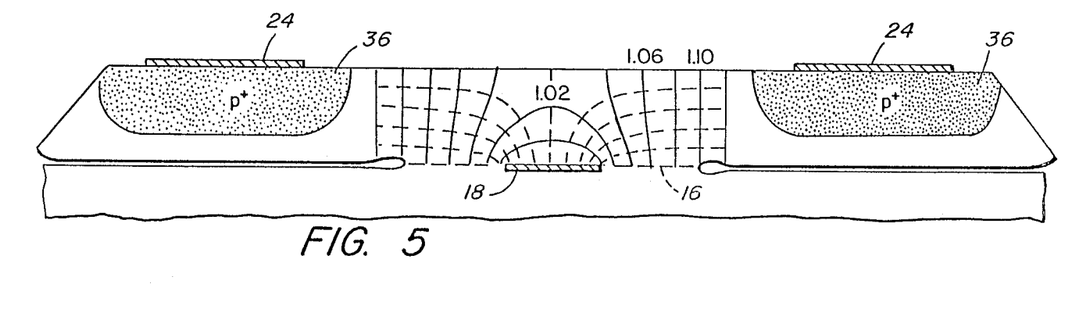
FIG. 5 is an illustration of the calculated current and voltage distributions near the active region in the diode of the present invention. The dashed curves are the streamlines of the current flowing into the active region. The solid curves are the equipotentials. The numbers labelling the voltage values are in volts.

FIG. 5 is a schematicized cross-sectional view of a portion of the mesa structure of FIG. 1 showing the equipotential lines generated when voltage is applied across the device. The current lines are shown dotted and the voltage lines are solid and are based upon calculations made using conformal mapping techniques. The dotted line extending from active strip 18 indicates the presence of a p-n homojunction of p-type InP from the top layer 12 and n-type InP from the substrate.

It should be noted that when the injected current is 50 mA, the equipotential voltage curve increases from a low of 0.98 volts near the active region 18 to a high of 1.12 volts near the contact region 36. Thus it is important that the electrical conductivity be as large as possible to minimize this voltage so that the homojunctions are not sufficiently biased that they conduct large current. For this purpose, an n-type cap layer with a p-type substrate would in fact be highly preferable to the inverse doping shown in the figure here. This is because the conductivity of n-type material can be much better than p-type material. Hence, the thickness of the top layer can be reduced in an n-type conductivity top layer structure and, consequently, the depth of the grating can also be reduced. Accordingly, this alternate construction is included in the scope of the invention, although our work to date has been with the conductivity type shown in the drawings.

II. Deep Etch Embodiment

Figure 3:
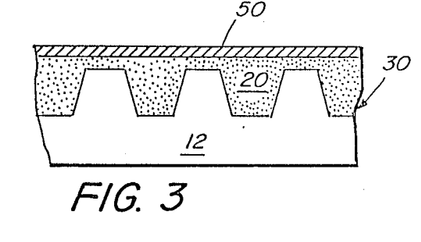
FIG. 3 is an enlarged cross-sectional view of a portion of the grating structure taken along lines III—III of FIG. 2.
Figure 6:
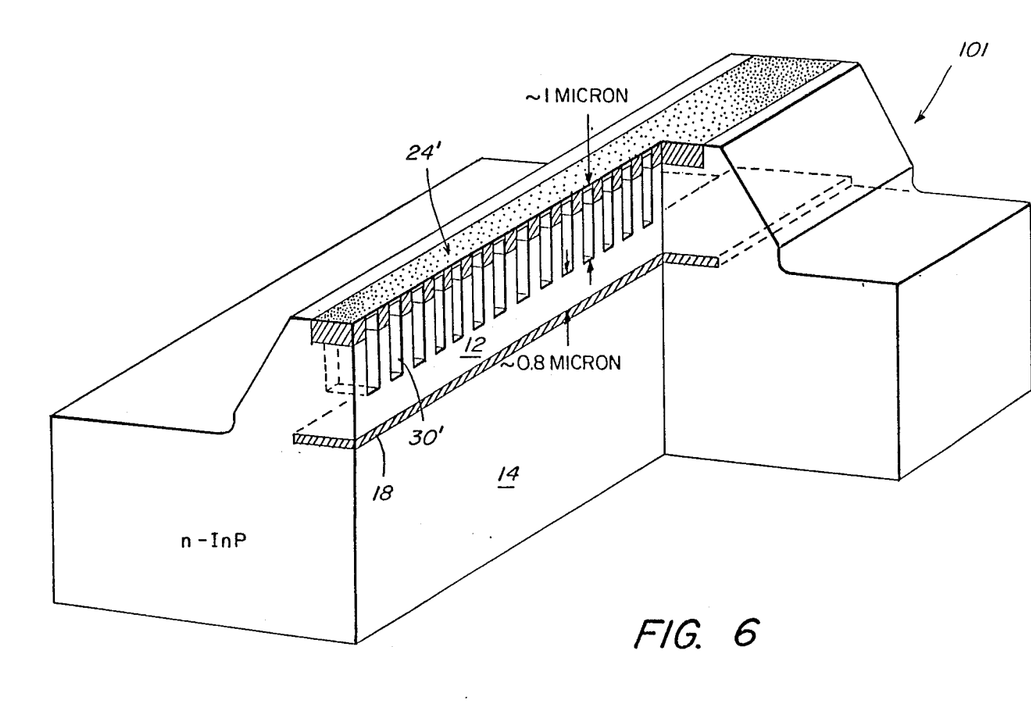
FIG. 6 is a schematicized partly sectioned perspective view of an alternate embodiment of the invention wherein the ohmic contact is formed on a deeply etched DFB grating.

Referring now to FIG. 6, an alternate embodiment of the invention will now be described in connection with FIG. 6 wherein like items retain the label designations of FIGS. 1–3. In this embodiment, the laser diode 10' is formed as in FIGS. 1–3 by the mass-transport technique or other stripe geometry buried active layer techniques. A mesa structure is thereby formed on a substrate 14 of n-type InP with a buried active strip 18 of InGaAsP covered by p-type InP top layer 12.

Top layer 12 is, however, made thicker, i.e., in the order of about 2.0 microns. After this structure is fabricated, a DFB grating 30' with a relatively deep etch is formed in the top layer 12. For an operating wavelength of 1.3 to 1.5 micrometers. A grating depth of about 1.0 micron is preferred with a top layer thickness of about 1.8 microns leaving a distance of about 0.8 microns between the active strip 18 and the bottom of grating 30'. Ohmic contact can be established at the top of the grating structure by evaporating an Au/Zn contact strip 24' at an angle to the grating structure. Any damage to the periodicity of the grating covered by the application of the contact strip is not sensed in the waveguide since the waveguide region is sufficiently remote that interaction only occurs in the un-metallized lower portion of the grating structure. This also means that the lossy metallized portion will not introduce loss of optical power by absorption. At the same time, because of the deep etch, the lower portion of the grating is sufficiently close to the waveguide region that good optical coupling is achieved.

III. Active Strip DFB Grating Embodiment

Figure 7A:
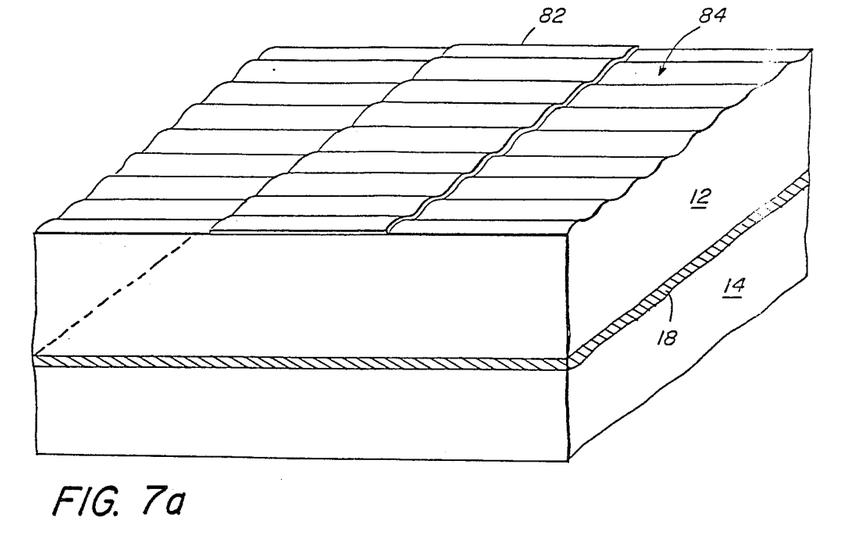
Figure 7B:
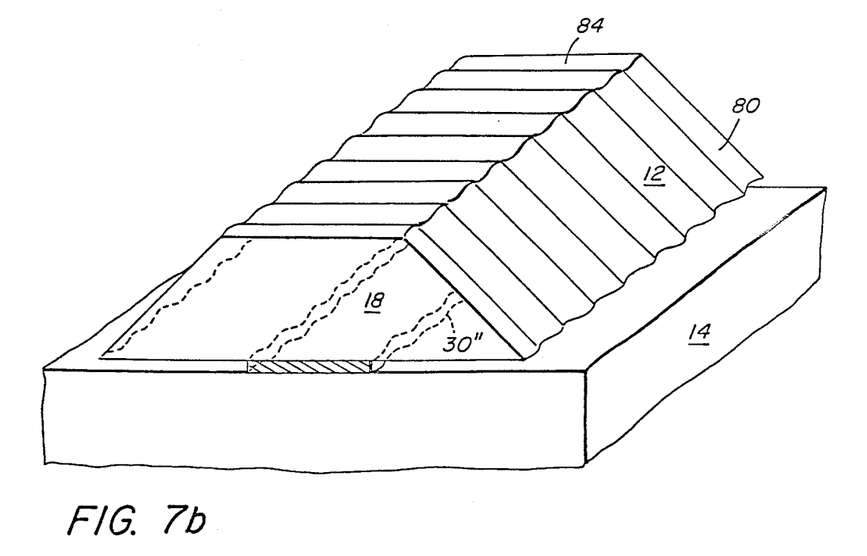

FIGS. 7(a)–7(e) will now be referred to for a description of an alternate embodiment of the invention wherein the DFB grating 30" is formed on the edges of the active strip 18. In this embodiment, the starting structure is shown in FIG. 7(a) to comprise a substrate 14 of n-type InP over which a layer 18 of InGaAsP is formed. A top layer 12 of p-type InP is formed over layer 18. A corrugated DFB defining surface 84 is etched upon top layer 12. This corrugated structure should have the proper periodicity for the DFB grating 30" to be transferred to the edges of active strip 18 [See FIG. 7(e)]. An oxide etch defining mask 82 is then formed over the corrugated surface 84 and portions of layer 12 exposed on each side of the mask are etched away to expose top layer 18 on each side. This process forms angularly extending corrugated side walls 80 of the same periodicity as surface 84.

Figure 7C:
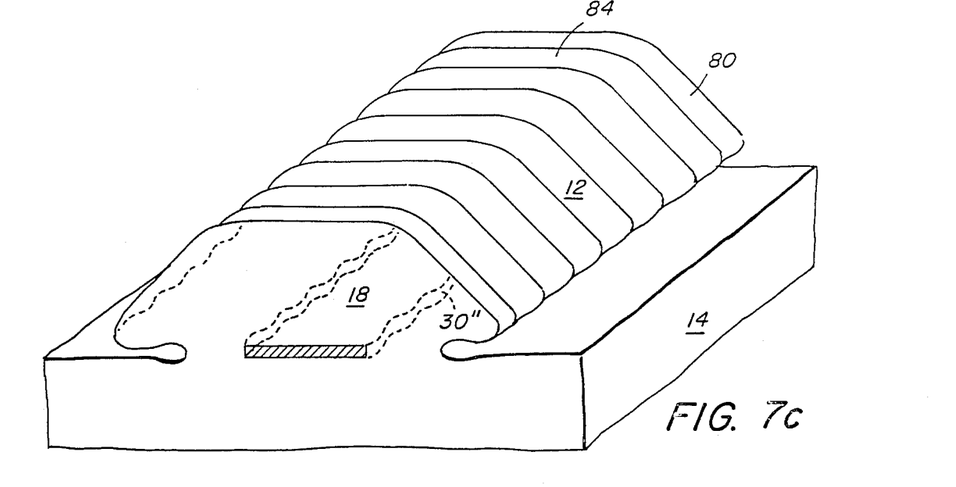

Next, portions of layer 18 are removed on each side of the side walls 80 and underneath the top layer 12 with a different etchant solution, i.e., potassium hydroxide and potassium ferricyanide (KOH and KFeCN). This results in the formation of a corrugated grating structure 30" of the same periodicity as surface 84 being formed on each side of active strip 18, as shown in FIG. 7(c).

Figure 7D:
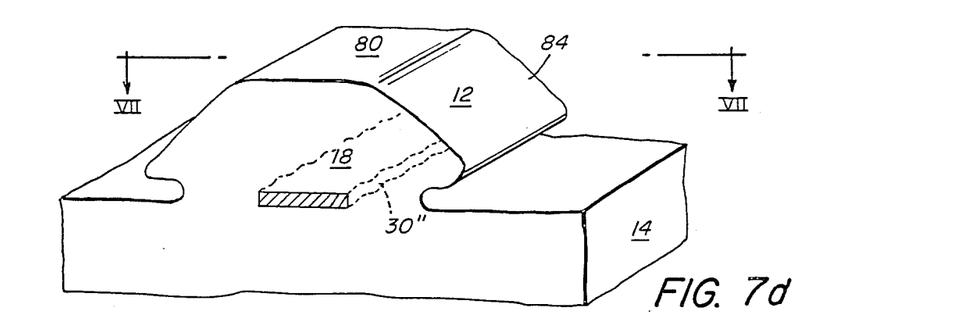
Figure 7E:
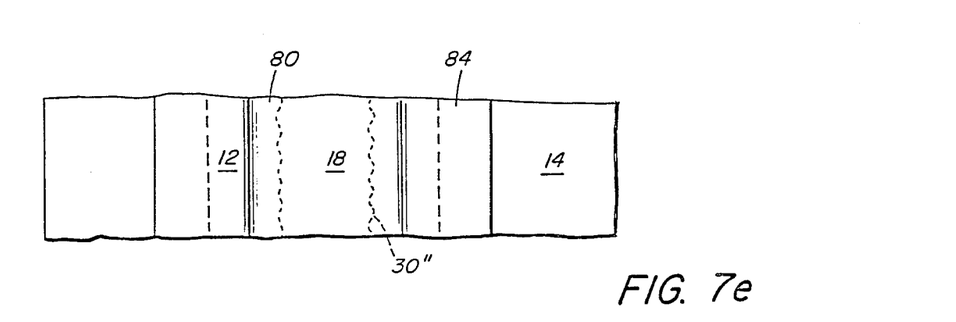
FIG. 7(e) is a top view through section VII of FIG. 7(d).

Next, the structure is subjected to a heating process (previously described) to effect mass transport of material around the undercut region, thereby burying the active strip 18 with the DFB side edge grating 30" formed thereon [See FIGS. 7(d) and (e)]. The mass-transport process smooths out the corrugations on surfaces 80 and 84 which are formed of InP yet retains the corrugations on active layer 18, apparently for some reason associated with the difference of materials.

IV. Surface Emitting DH Type DFB Laser Diode

Figure 8:
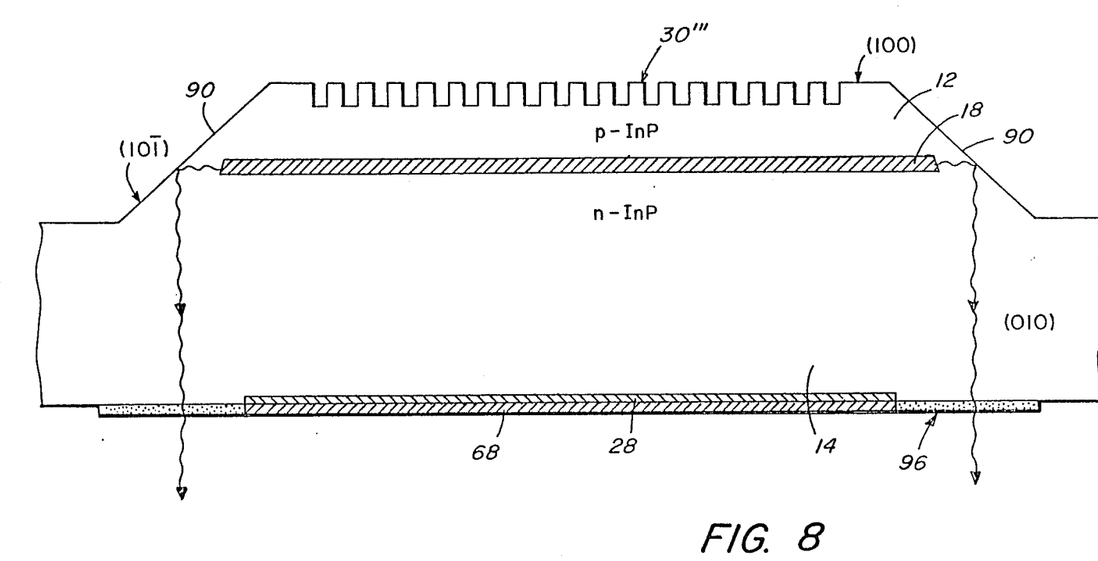
FIG. 8 is a longitudinal side sectional view of an alternative embodiment in which a surface emitting DH type DFB laser is formed.

Referring now to FIG. 8, a further embodiment of the invention will be explained in connection therewith. (Note: This embodiment contains some similarities to the FIG. 7 embodiment of co-pending U.S. Patent Application filed Jan. 22, 1985 (Attorney's 693207 Jan. 22, 1985. In this embodiment of the present invention, laser radiation is directed at a 90° angle to the plane of the active layer 18 and out the substrate (14) surface to provide a surface emitting laser diode structure.

The starting structure for fabrication of such a device comprises a substrate layer 14 which may be formed of n-doped indium phosphide. Over this substrate, an active layer 18 of indium gallium arsenide phosphide (GaInAsP) is formed.

A top layer of p-doped indium phosphide 12 is then formed over layer 18, providing a planar p-n junction at the interface between the layers. Preferably, the substrate layers have their crystallographic planes oriented, as shown in FIG. 8.

An oxide mask is formed on the top surface of layer 12. By well-known selective chemical etching techniques using etchants previously described, surfaces underlying the oxide mask are formed at a 45° angle to the plane of the p-n junction device. The 45° angle is obtained by virtue of the fact that the crystallographic plane of the top layer 12 is oriented as shown with the 010 plane being at the long face of the active layer and the 001 plane being oriented normal thereto.

Next, a different etchant is used to undercut layer 18 below layer 12. Next the wafer is subjected to a heat treatment at the temperature and for a time period previously given to transport some of the material from layers 12 and 14 into the undercut region to bury the active layer 18.

Next, an oxide mask is formed again over the structure and the selective etching process is resumed to form surfaces 90' at a 45° angle with respect to the plane of the p-n junction formed between layers 12 and 14.

A grating structure 30''' is then formed on the top surface of layer 12 and contacts (not shown are formed either over the grating or adjacent thereto, as described previously). Light emitted out the edge of active layer 18 is reflected off surface 90 passes through light transparent substrate 14 and an antireflective coating 96 formed below surface 90 and emerges in a plane normal to the p-n junction and, hence, the surface of substrate 14, as shown by the arrows in FIG. 8.

This device of FIG. 8 not only has the advantage of being surface emitting, but also has considerably reduced mirror reflections. Mirror reflections are highly undesirable for most DFB lasers. In the FIG. 8 device, the weakly reflected light from the anti-reflectively coated surface 96 diffracts a relatively large distance, and therefore with further reduced intensity, before reaching the active region 18.

This completes the description of the preferred embodiments of the invention, however, it is to be understood that while lasers using a heterojunction of the quaternary III-V alloys of indium gallium arsenide phosphide have been chosen to illustrate the invention; other alloys may be utilized equally as well. As an example, alloys of the IV-VI semiconductors, such as germanium IV and selenium VI and lead and tellurium may be utilized. Similarly, instead of indium phosphide, other III-V alloys could be considered, such as gallium antimonide.

The term quanternary III-V alloy of InGaAsP means that the elements are proportioned according to the formula, $In_xGa_{1-x}As_yP_{1-y}$ or the equivalent mole fraction formula $In_{0.5x}Ga_{0.5-0.5x}As_{0.5y}P_{0.5-0.5y}$. Also, the invention is not to be limited to any particular etchant, merely that the second etchant has to be capable of etching the active layer with negligible etching of the buffer layer substrate or the top layer.

Also, it may be desirable to form an intermediate terniary or quaternary layer between the InP top layer 12 and the contact or grating structure to minimize contact resistance.

While the heretofore described embodiments have been explained in connection with the use of a wet chemical etching process, it is also contemplated that other means of producing the undercuts or DFB structures may be realized by those skilled in the art, such as plasma etching.

While the particular embodiments of the invention disclosed herein have been fabricated utilizing LPE techniques, it should be emphasized that suitable layers could be formed using other deposition techniques, such as vapor phase epitaxy or molecular beam epitaxy. Additionally, whereas the substrates enumerated herein have been n-type indium phosphide, it is clear that the substrates could be p-type, in which case the top layer would be of opposite type conductivity. Also, additional quaternary or other layers may be present in addition to those layers above enumerated.

Equivalents

Hence, the invention is not to be construed as limited to the particular embodiment shown and described herein. There are many equivalents to these specific embodiments and such equivalents are intended to be covered by the following claims:

We claim:

1. The method of forming a periodic structure on the sides of a buried strip of active semiconductive material in a laser diode comprising the steps of:
   (a) forming a first body of semiconductor material having a first type conductivity;
   (b) forming a first layer of active lasing semiconductor material on said first body;
   (c) forming a second layer of semiconductor material of opposite conductivity to said first type over said first layer;
   (d) forming a periodic structure in, and extending along, an external surface of said second layer and adjacent said first layer;
   (e) removing portions of said second layer surface to expose portions of said first layer;
   (f) removing the exposed portions of said first layer, as well as portions of said first layer adjacent the exposed portions to form an undercut region between said first body and second layer and to transferring the periodic structure formed in step (d) to opposite sides of said first layer; and
   (g) heating the structure for a sufficient time at a sufficient temperature to cause the material of said first body and second layer to fill in the undercut region without disturbing the periodic structure formed in the first layer.

2. The method of claim 1 wherein a first selective etchant is used in step (e) and an etchant mask is formed on the second layer area where the periodic structure is to be formed on the first layer; such that the first etchant removes portions of the material in the second layer not underlying the mask and forms a periodic structure on the side walls of the second layer extending from either side of the mask down to the surface of the first layer.

3. The method of claim 2 wherein a second selective etchant is used in step (f) to only etch the exposed first layer on each side of the mask and underneath the second layer to form a narrow strip of active layer with a periodic structure formed on each side of the strip.

4. The method of forming a DFB laser heterojunction device having alternate layers of semiconductor material with at least a first layer of one type conductivity, a second layer and a third layer of opposite conductivity comprising the steps of:
   (a) selectively etching only the third material until a mesa of third material is formed over the second layer and a surface of second layer material is exposed on two sides of said mesa;
   (b) selectively etching only the second layer material at the exposed surfaces until two undercut regions are formed under the mesa with a layer of second material therebetween which is exposed on two sides; and
   (c) filling in the undercut region with material from said mesa and first layer sufficient to bury the exposed portions of said second layer material;
   (d) forming a DFB grating structure on an exposed surface of one of the first or third layers adjacent the buried second layer.

5. A method of forming a double heterostructure distributed feedback type laser comprising:
   (a) forming a first body of semiconductor material having a major surface and a first type conductivity;
   (b) forming a second body in the shape of a mesa of semiconductor material having a conductivity opposite said first type conductivity, said second body having an external plateau surface and an adjacent surface opposite said plateau surface;
   (c) embedding a strip of active semiconductor material of narrower bandgap than the bandgap of the first and second bodies between said first and second bodies;
   (d) forming a periodic structure in the plateau of the second body extending in parallel proximity with the strip of active semiconductor material;
   (e) forming at least one ohmic contact strip on said plateau adjacent the periodic structure; and
   (f) forming contact means on said first body.

6. The method of claim 5 wherein two ohmic contact strips are formed in step (e), one on each side of said periodic structure and the second body is undercut adjacent the strip on each side underneath a portion of the contact strips.

7. A method for forming a distributed feedback type laser comprising:
   (a) forming a first body of semiconductor material having a major surface and a first type conductivity;
   (b) forming a second body in the shape of a mesa with an external plateau surface and formed of semiconductor material of conductivity opposite said first type conductivity and having a major surface adjacent to the major surface of said first body;

(c) embedding a strip of active semiconductor material between said two bodies and extending along the major surfaces;

(d) forming a periodic structure in said plateau surface adjacent said strip; said structure comprising corrugations extending into said surface of sufficient depth such that light waves travelling along the region of the active layer interact with proximate portions of the corrugations but not the remote portions;

(e) forming ohmic contact means on the remote portions of the corrugations.

8. The method of claim 7 wherein the ohmic contact means is formed by angle evaporation.

9. A method of forming a laser comprising:
(a) forming a first body of semiconductor material having a first type conductivity;
(b) forming a second body of semiconductor material of opposite type conductivity to the first type;
(c) forming a strip of active lasing material between and embedded in said first and second bodies, said strip having a pair of side walls extending between said bodies;
(d) forming a periodic structure on at least one side wall of said embedded strip; and
(e) forming contact means on said first and second body.

10. The method laser of claim 9 wherein the periodic structure is formed by first forming a top periodic structure on an external surface of the second body then transferring the periodicity of said top periodic structure to at least one said side wall of said strip before the strip is embedded.

11. The method of forming a surface emitting laser with distributed feedback comprising:
(a) forming a first body of semiconductor material having a first type conductivity and a major surface;
(b) forming a second body of semiconductor material of opposite type conductivity to the first type and a major surface;
(c) forming a strip of active semiconductor material buried between the major surfaces of the first and second bodies;
(d) forming a periodic structure in an external surface of the second body extending adjacent to said strip;
(e) forming at least one mirror-like surface extending transversely from the external surface of the second body at about a 45° angle to said surface and adjacent an edge of the strip to reflect light emitted from the edge of the strip in a plane normal to the major surfaces and out the major surface of the first body; and
(f) forming contact means on said first and second bodies.

12. The method of claim 11 wherein the mirror-like surfaces are formed by etching the first and second bodies in a crystallographic plane extending at a 45° angle to the external surface of the second body.

13. The method of claim 11 wherein an anti-reflective coating is formed on the major surface of the first body at the exit location of the emitted light.

14. The method of claim 11 wherein the first and second bodies are formed of a binary compound and the strip of quaternary material is selected from the III-V class of semiconductor materials.

15. The method of claim 11 wherein the binary compound is InP and the quaternary is InGaAsP.

16. A method of forming a heterostructure distributed feedback type laser comprising:
(a) forming a substrate of semiconductor material having a major surface and a first type conductivity;
(b) forming a layer of semiconductor material having a conductivity opposite said first type conductivity in the shape of a mesa with an external plateau surface and an underlying surface;
(c) forming a strip of active semiconductor material of narrower bandgap than the bandgap of the semiconductor material of the substrate or the layer on said major surface of the substrate and embedded between said substrate and said layer;
(d) forming a periodic structure in the plateau of said layer and extending in parallel proximity with the strip of active semiconductor material;
(e) forming first ohmic contact means on said plateau adjacent the periodic structure; and
(f) forming second ohmic contact means on said substrate.

17. The method of claim 16 wherein a pair of ohmic means is formed, one on each side of said periodic structure.

18. The method of claim 16 wherein the strip is embedded by undercutting the strip on each side underneath a portion of the contact strips.

19. The method of claim 16 wherein the material of the substrate and a layer is a binary compound and the material of the strip is a quaternary semiconductor.

20. The method of forming a laser comprising:
(a) forming a substrate having a major surface and comprised of semiconductor material having a first type conductivity;
(b) forming a layer on the substrate in the shape of a mesa having a plateau surface and an underlying surface aligned with the major surface of the substrate, said layer being comprised of semiconductive material of opposite conductivity to said substrate material;
(c) forming a strip of active semiconductor material between said substrate layer and embedded therein adjacent an undercut portion between the substrate and layer;
(d) forming a periodic structure for providing a distributed feedback network in the plateau surface of the layer adjacent the strip;
(e) forming an ohmic contact strip on said plateau surface adjacent said periodic structure and at least partially overlying said undercut portion; and
(f) forming an ohmic contact on said substrate.

21. The method of claim 20 wherein the semiconductor materials are III-V materials.

22. The method of claim 20 wherein the substrate and layer are formed of a binary compound and the active material of quaternary material.

23. The method of claim 22 wherein the active material is GaInAsP and the binary compound is InP.

24. The method of forming a laser comprising:
(a) forming a substrate of semiconductor material having a major surface and a first type conductivity;
(b) forming a layer of semiconductor material of conductivity opposite said first type conductivity and having a major surface adjacent to the major surface of said substrate and formed in the shape of a mesa with an external plateau surface;

(c) forming a strip of active semiconductor material embedded between said substrate and layer extending along the major surfaces;

(d) forming a periodic structure in said plateau surface adjacent said strip; said structure comprising corrugations extending into said surface of sufficient depth such that light waves travelling along the region of the active layer interact with proximate portions of the corrugations but not the remote portions;

(e) forming ohmic contact means on the adjacent remote portions of the corrugations and on said substrate.

25. The method of claim 24 wherein the layer is formed of a binary compound material about 2.0 microns in thickness and the depth of the corrugations is about 1.0 microns and the ohmic contact means on the remote portions is comprised of metallic material formed on the corrugations to a depth of about 0.3 microns.

26. The method of forming a laser comprising:
(a) forming a substrate of semiconductor material having a first type conductivity;
(b) forming a layer of semiconductor material of opposite type conductivity to the first type;
(c) embedding a strip of active lasing material between said substrate and layer, said strip having a pair of side walls extending between said substrate and layer with a periodic structure on at least one side wall of said embedded strip; and
(d) forming contact means on said substrate and layer.

27. The method of claim 26 wherein the periodic structure is formed by transferring the periodicity of a periodic structure formed on an external surface of the second body to at least one said side wall of said strip before the strip is embedded.

28. Forming a surface emitting laser comprising:
(a) forming a substrate of semiconductor material having a first type conductivity and a major surface;
(b) forming a layer of semiconductor material of opposite type conductivity to the first type and a major surface;
(c) forming a strip of active semiconductor material buried between the major surfaces of the substrate and layer;
(d) forming a periodic structure in an external surface of the layer extending adjacent to said strip;
(e) forming at least one mirror-like surface extending transversely from the external surface of the layer at about a 45° angle to said surface and adjacent an edge of the strip to reflect light emitted from the edge of the strip in a plane normal to the major surfaces and out the major surface of the substrate; and
(f) forming contact means on said substrate and layer.

29. The method of claim 28 wherein the mirror-like surfaces are formed by etching the substrate and layer in a crystallographic plane extending at a 45° angle to the external surface of the second body.

30. The method of claim 28 wherein an anti-reflective coating is formed on the major surface of the substrate at the exit location of the emitted light.

31. The method of claim 28 wherein the first and second bodies are formed of a binary compound and the strip of quaternary material selected from the III-V class of semiconductor materials.

32. The method of claim 31 wherein the binary compound is InP and the quaternary is InGaAsP.

33. The method of forming a DFB laser heterojunction device from a doped indium phosphide substrate upon which a gallium indium arsenide phosphide active layer is formed and a layer of indium phosphide, doped opposite to said substrate, formed on said active layer, comprising the steps of:
(a) selectively etching the indium phosphide layer until a mesa of indium phosphide is formed over the active layer and a surface of active layer material is exposed on two sides of said mesa;
(b) selectively etching only the active layer material at the exposed surfaces until two undercut regions are formed under the mesa with a strip of active material therebetween which is exposed on two sides of said strip; and
(c) filling in the undercut region with indium phosphide from said mesa and substrate sufficient to bury the exposed side portions of said strip;
(d) forming a grating structure on an exposed surface of either the indium phosphide substrate or the indium phosphide layer.

* * * * *